United States Patent [19]

Schlesinger et al.

[11] 4,054,732

[45] Oct. 18, 1977

[54] DRY PHOTOPOLYMER IMAGING PROCESS

[75] Inventors: Sheldon Irwin Schlesinger, East Windsor Township, County of Mercer; Ronald J. Boszak, Trenton, both of N.J.

[73] Assignee: American Can Company, Greenwich, Conn.

[21] Appl. No.: 690,308

[22] Filed: May 26, 1976

Related U.S. Application Data

[62] Division of Ser. No. 486,169, July 5, 1974, Pat. No. 3,997,344.

[51] Int. Cl.$^2$ .................. C08F 216/14; C08F 220/32
[52] U.S. Cl. ........................... 526/273; 96/33; 204/159.14; 526/208
[58] Field of Search .......................... 526/273

[56] References Cited

U.S. PATENT DOCUMENTS

| | | | |
|---|---|---|---|
| 3,065,213 | 11/1962 | Vandenberg | 526/273 |
| 3,708,296 | 1/1973 | Schlesinger | 96/91 R |
| 3,935,375 | 1/1976 | Ichiba et al. | 526/273 |

*Primary Examiner*—Harry Wong, Jr.
*Attorney, Agent, or Firm*—Robert P. Auber; Ernestine C. Bartlett; George P. Ziehmer

[57] ABSTRACT

Copolymers of glycidyl acrylate and allyl glycidyl ether and terpolymers derived from addition of glycidyl methacrylate to the polymerizable mixture, having an inherent viscosity within the range of about 0.09 to 0.28 and an epoxy equivalent of at least about 0.64 per 100 g. of polymer are provided which upon admixture with a catalyst which is a radiation-sensitive aryldiazonium salt of a complex halogenide, provides compositions suitable for use in a dry photopolymer positive imaging process. In the process, the polymer which is non-tacky at room temperature, together with the catalyst is applied to a substrate and exposed to an energy source for example, electromagnetic radiation through a transparency or mask. Following exposure, the coating is heated to the softening point of the unexposed portion of the coating and a powder or toner is applied thereto, the toner being adhered to only the tacky, non-exposed area of the coating, resulting in a pigmented image.

3 Claims, No Drawings

DRY PHOTOPOLYMER IMAGING PROCESS

This is a division of application Ser. No. 486,169, filed July 5, 1974, and is now U.S. Pat. No. 3,997,344, issued Dec. 14, 1976.

BACKGROUND OF THE INVENTION

In U.S. Pat. No. 3,708,296 to Sheldon I. Schlesinger entitled "Photopolymerization of Epoxy Monomers" issued Jan. 2, 1973, there are disclosed novel compositions comprising various epoxide materials and certain latent curing catalysts therefor. Such compositions are photosensitive and when exposed to an energy source such as actinic radiation yield epoxy polymers which are receptive to ink and possess inherent toughness, abrasion resistance, adherence to metal surfaces, resistance to chemical attack, etc. and are thus valuable for many applications particularly those involving formation of acid and alkali resist images for chemical milling, gravure images, offset plates, stencil-making, etc.

Additionally, in copending application Ser. No. 297,829 filed Oct. 16, 1972, now abandoned and commonly assigned herewith, certain copolymers of glycidyl methacrylate and allyl glycidyl ether were found to exhibit improved curing rates, electron sensitivity, photosensitivity and other properties which rendered them especially suitable for use in preparation of articles for storing and recording information from laser or electron beam sources or in microfilm preparation, in the presence of the sensitizers therein described.

It has now been discovered that specific epoxide materials, copolymers of glycidyl acrylate and allyl glycidyl ether, specially prepared, when utilized with latent curing catalysts, are unique in being tacky at an elevated temperature before light curing and becoming hard and non-tacky upon exposure to light in an image-wise manner. The copolymers also have the property of being substantially non-tacky at room temperature and have the ability to imbibe toner or pigment in inverse proportion to the amount of light received. Such properties render the copolymers eminently suitable for use in dry photopolymer imaging processes, i.e. imaging processes which permit elimination of solvents. The ecological advantage of such a process is devoid of waste-solvent disposal is readily evident.

Various systems have been heretofore described in which a tacky photopolymer is exposed imagewise to actinic radiation whereby the exposed areas are crosslinked or polymerized losing their tack after which a dye, pigment or toner is applied to the surface. Only the unexposed areas pick up the colorant because of their tack thus forming a positive reproduction of the image.

Such processes have been used to transfer images from the original and are known commerically as Adherography or Custom Toning. However, none of the existing systems are without attendant disadvantages. The use of a system that is tacky at room temperature requires special handling of the unexposed film and fixing of the image after development. Conversely, with systems that are non-tacky at room temperature, solvents and other liquids are often necessary to make the substances tacky when tackiness is required. Many of the systems have poor shelf life and require long exposure times or high energy requirements, etc. The majority of such prior systems involve addition-polymerization reaction mechanisms which have the disadvantageous tendency of absorbing oxygen from the air which acts as a polymerization inhibitor, lowers the radiation sensitivity of the system and necessitates, in addition to high intensity sources of radiation, covering the photopolymer surface with a plastic film to protect the tacky coating and to prevent oxygen inhibition.

There is therefore a continued need in the art for dry photopolymer imaging systems which are devoid of the disadvantages enumerated above.

SUMMARY OF THE INVENTION

The present invention provides novel copolymers of glycidyl acrylate and allyl glycidyl ether having pendant epoxy groups, having an inherent viscosity within the range of about 0.09 to 0.28 and an epoxide equivalent of at least about 0.64 derived from a process which comprises admixing the respective monomers, in the presence of a polymerization catalyst such as benzoyl peroxide, in a solvent which permits reflux of the reactants at a temperature below about 90° C.

The invention also provides terpolymers having the same inherent viscosity and expoxide equivalent as described above derived from polymerization of allyl glycidyl ether, glycidyl acrylate and glycidyl methacrylate.

The invention further provides novel polymerizable compositions containing, as latent curing catalysts, aryl diazonium salts of complex halogenides which are radiation-sensitive and release an active catalyst upon exposure to an energy source such as actinic radiation and the use of such compositions in a dry imaging process.

DETAILED DESCRIPTION OF THE INVENTION

Glycidyl acrylate-allyl glycidyl ether copolymers and preparations thereof.

The copolymers of the present invention are characterized by having an inherent viscosity within the range of 0.09 to 0.28 preferably 0.15 to 0.25 and an epoxide equivalent of at least about 0.64, preferably 0.69 to 0.74 epoxide equivalent per 100g. of polymer. These parameters are of a critical nature since copolymers having either inherent viscosities outside of the specified range or epoxy equivalents of less than 0.64 are deficient for the purpose of the present invention.

The values of inherent viscosity herein are measured in butyronitrile at 25° C unless otherwise indicated. The inherent viscosity is an indication of molecular weight and is determined according to the equation $$\eta\ inh = [\ln (\eta_1/\eta_0)]/C$$

where $C$ = concentration of copolymer in grams per 100 ml. of solvent and $\ln (\eta_1/\eta_0)$ = the natural logarithm of the relative viscosity of the dilute solution.

As is well known in the art, inherent viscosity is an indication of molecular weights of polymers. Thus, molecular weights for the copolymers of this invention having inherent viscosities of about 0.25 are indicated to be about 4200.

The epoxide equivalent and inherent viscosity of the copolymer received are selectively controlled by the reaction conditions in terms of temperature and relative molar proportions of the reacting monomers and catalysts. In general, copolymers exhibiting the desired viscosity and epoxide equivalent may be obtained when employing molar proportions from about 0.9:1 to 7:1 of the glycidyl acrylate to allyl glycidyl ether, the preferred proportions being within the range of about 1-6 moles of glycidyl acrylate per mole of allyl glycidyl ether.

The copolymerization is conducted in the presence of a polymerization catalyst which is a free radical generator and which facilitates copolymerization via the double bonds thus rendering a product having pendant epoxy groups suitable for further polymerization via the radiation-sensitive initiators. Examples of such catalysts include benzoyl peroxide, azo-bis (isobutyronitrile), p-chlorobenzoyl peroxide, t-butylperoxyoctoate, t-butylperoxy maleic acid, lauroyl peroxide, butyl peroxide, etc. of which benzoyl peroxide is the preferred catalyst. Generally, the catalyst is employed in amounts ranging from 0.20 to 0.60 mol%, based on the total molar concentration of the monomers and is preferably from 0.24 to 0.55 mol %.

The reaction may be carried out in various solvents which have boiling points below 90° C if refluxing is to be used as the means of temperature control. But solvents with higher boiling points may be used if an external temperature control is used. Examples of suitable reaction solvents include methyl ethyl ketone, acetone, dimethyl ether of diethylene glycol, monochlorobenzene, o-chlorotoluene, o-dichloro-toluene, acetonitrile, butyronitrile, etc. and mixtures thereof of which methyl ethyl ketone is preferred.

Copolymers are prepared by admixing the monomers in a solvent containing the polymerization catalyst after which the reaction mixture is heated to reflux and maintained at reflux temperature for a period of about 3 to 6 hours. The reaction mixture is subsequently allowed to cool to room temperature and the copolymer is precipitated from a suitable solvent such as methanol, ethanol, isopropanol or like compound which is a solvent for the catalyst and unreacted monomers but in which the copolymer is insoluble. The product is then dried at room temperature. Substantially higher drying temperatures are to be avoided to eliminate undesirable crosslinking, increases in molecular weight or insolubilization (further polymerization) of the copolymer.

The following examples illustrate typical preparations of copolymers of the invention.

EXAMPLE 1

A. Into a 1000 ml. resin flask equipped with a reflux condenser, thermometer, stirrer assembly were placed 81.1g of glycidyl acrylate, 13.5g allylglycidyl ether and 0.88g of benzoyl peroxide in 300 ml. of methyl ethyl ketone. The reaction solution was heated at reflux with stirring for 5¼ hours at which time it was permitted to cool for 1 hour with stirring. 250 ml. of methyl ethyl ketone was then stirred in and the solution was permitted to cool to room temperature overnight. The solution was filtered and added slowly, preferably dropwise, to 500 ml. of vigorously stirred methanol. The thus precipitated white product was collected and washed thoroughly with methanol after which it was suction dried at room temperature at gradually reduced pressure down to 1.5 mm. There was obtained 66g. of a rubbery, clear copolymer having an inherent viscosity 0.25 in butyronitrile at 25°, Tg=64°, an epoxy equivalent 0.70/100g and an average molecular weight of 4182.

B. The procedure of A above was repeated except that the benzoyl peroxide concentration was reduced to 0.44g. There was obtained 68g of a copolymer having an epoxy equivalent of 0.70/100 g and an inherent viscosity of 0.17.

EXAMPLE 2

A mixture containing 81.1g glycidyl acrylate, 72g allyl-glycidyl ether, 400 ml. methyl ethyl ketone and 1.15g. benzoyl peroxide was heated with stirring at reflux for 5¼ hours employing the apparatus of Example 1. After allowing the clear solution to cool for 1 hour, an additional 400 ml. of methyl ethyl ketone was added and it was left to stand overnight.

The solution was then filtered directly into 800 ml. of absolute ethanol. An oily, sticky material settled out on standing. After decanting off the solvent and washing the sticky polymer with methanol, it was dried with a water aspirator vacuum in a cold vacuum oven. It was finally dried using the vacuum pump setting down to 2 mm pressure with a dry ice trap.

There was obtained 53.0g of a copolymer having an epoxy equivalent of 0.67/100g and an inherent viscosity of 0.19.

Glycidyl acrylate-allyl glycidyl ether-glycidyl methacrylate terpolymers and preparation thereof.

Also applicable in this invention where reduced tackiness (a small reduction) is desired, is the replacement of a small part of the glycidyl acrylate monomer by glycidyl methacrylate in the free radical copolymerization mixture. Thus, while maintaining the allylglycidyl ether concentration within the appropriate molar proportions set forth hereinabove, for example at 15.7 mole-% of the total monomer mixture, the composition of the remaining polymerizable monomer, in this instance, 84.3 mole-%, may be varied to contain up to about 0.25 mole of glycidyl methacrylate for each mole of glycidyl acrylate, but preferably up to about 0.15 moles of glycidyl methacrylate per mole of glycidyl acrylate. Amounts of glycidyl methacrylate relative to glycidyl acrylate in excess of this act to remove the useful tackiness property as illustrated further hereinbelow.

The terpolymers have the same characteristics of epoxy equivalent and inherent viscosity as set forth above and are prepared by the same method. The following example illustrates a typical preparation of a terpolymer of the invention:

EXAMPLE 3

Into a 1000 ml resin flask equipped with a reflux condenser, thermometer, and stirrer assembly, were placed 22.5 g allylglycidyl ether (0.197 mole) 18.8g (0.132 mole) glycidyl methacrylate, 118g (0.921 mole) glycidyl acrylate, 500 ml methyl ethyl ketone, and 1.46g benzoyl peroxide (0.006 mole). The reaction solution was heated under reflux with stirring for 5 hours, and then allowed to cool to room temperature. An additional 500 ml of methyl ethyl ketone was then stirred in and the resulting solution was filtered. This filtrate was then added dropwise to a mixture of 1000 ml methanol and 1500 ml isopropanol, with vigorous stirring. The white, gummy precipitate that formed was washed several times with fresh isopropanol, and then dried, with the final drying under 0.5 mm. of vacuum. There was obtained 91.9g of a pliable polymer. It had an inherent viscosity = 0.16, and 0.72 epoxy equivalent /100.

Polymer-Catalyst Compositions and Polymerization thereof in a Dry Imaging Process.

In the description which follows, the term "copolymer" will be understood to designate actual copolymers of the invention as well as the terpolymers which result from incorporation of glycidyl methacrylate in the polymerizing mixture.

In accordance with the present invention, glycidyl acrylate-allyl glycidyl ether copolymers or the terpolymers above described are admixed with a Lewis acid catalyst precursor. The resulting mixture, at a convenient time subsequently is exposed to irradiation, for example, electromagnetic or electron beam irradiation, to release the Lewis Acid catalyst in sufficient amounts to initiate the desired polymerization reaction and used in a dry photoimaging process as described herein below.

The materials utilized as latent polymerization initiators in the process and compositions of the present invention are radiation-sensitive catalyst precursor which decompose to effect polymerization upon application of energy. The energy required for effective decomposition may be energy applied by bombardment with charged particles, notably by electron beam irradiation. Preferably, however, the catalyst precursors are photosensitive and the required energy is imparted by electromagnetic irradiation and especially actinic irradiation which is most effective at those regions of the electromagnetic spectrum at which there is high absorption of electromagnetic energy by the particular catalyst precursor used. More than one of these types of energy may be applied to the system, e.g. ultra-violet light irradiation followed by electron beam irradiation. It is a unique feature of the copolymers of the invention that irradiation alone without subsequent heating is sufficient to effect a rapid and satisfactory cure.

The radiation-sensitive Lewis acid catalyst precursors are aromatic diazonium salts of complex halogenides which decompose upon application of energy to release a halide Lewis Acid as disclosed in U.S. Pat. No. 3,708,296 and may be prepared using procedures known in the art as disclosed therein, said disclosure being incorporated herein by the aforegoing reference. The aromatic diazonium cation may be represented generally as $(AR-N\equiv N)^+$, where the aryl group Ar, which may be an alkaryl hydrocarbon group, is bonded to the diazonium group by replacing one of the hydrogen atoms on a carbon atom of the aromatic nucleus, and where the aryl group ordinarily carries at least one pendant substituent for greater stability of the cation. Thus the pendant substituent may be alkyl, or another substituent, or both. The complex halogenide anion may be represented by $(MX_{n+m})^{-m}$. Thus, the photosensitive salt and its decomposition upon actinic irradiation may be depicted as follows:

(I)

where X is the halogen ligand of the complex halogenide, M is the metallic or metalloid central atom thereof, m is the net charge on the complex halogenide ion, and n is the oxidation state of M and the number of halogen atoms in the halide Lewis acid compound released. The Lewis acid halide $MX_n$ is an electron pair acceptor such as $FeCl_3$, $SnCl_4$, $PF_5$, $AsF_5$, $SbF_5$, $BiCl_3$, and $BF_3$ which upon suitable irradiation of the diazonium complex salt is released in substantial quantities and initiates or catalyzes the polymerization process, wherein the polymeric material is polymerized or cured as the result of the actinic irradiation.

Illustrative of the aromatic diazonium cations comprised in the photosensitive catalyst salts utilized in accordance with the present invention are the following:

p-chlorobenzenediazonium
2,4-dichlorobenzenediazonium
2,5-dichlorobenzenediazonium
2,4,6-trichlorobenzenediazonium
2,4,6-tribromobenzenediazonium
o-nitrobenzenediazonium
p-nitrobenzenediazonium
4-nitro-o-toluenediazonium (2-methyl-4-nitrobenzenediazonium)
2-nitro-p-toluenediazonium (4-methyl-2-nitrobenzenediazonium)
6-nitro-2,4-xylenediazonium (2,4-dimethyl-6-nitrobenzenediazonium)
2-chloro-4-(dimethylamino)-5-methoxybenzenediazonium
4-chloro-2,5-dimethoxybenzenediazonium
2,4',5-triethoxy-4-biphenyldiazonium (2,5-diethoxy-4-(p-tolyl)benzenediazonium)
2,5-diethoxy-4-(phenylthio)benzenediazonium
2,5-diethoxy-4-(p-tolylthio)benzenediazonium
p-morpholinobenzenediazonium
2,5-dichloro-4-morpholinobenzenediazonium
2,5-dimethoxy-4-morpholinobenzenediazonium
4-(dimethylamino)-1-naphthalenediazonium Illustrative of the complex halogenide anions comprised in the photosensitive catalyst salts utilized in accordance with the present invention are the following:

tetrachloroferrate(III), $FeCl_4^-$
hexachlorostannate(IV), $SnCl_6^{2-}$
tetrafluoroborate, $BF_4^-$
hexafluorophosphate, $PF_6^-$
hexafluoroarsenate(V), $AsF_6^-$
hexafluoroantimonate(V), $SbF_6^-$
hexachloroantimonate(V), $SbCl_6^-$
pentachlorobismuthate(III, $BiCl_5^{2-}$ A selection of aromatic diazonium salts of complex halogenides is listed in Table I of the aforementioned U.S. Pat. Nos. 3,708,296 and 3,794,576 issued Feb. 26, 1974, such disclosures being incorporated herein by reference thereto.

Referring to equation I hereinabove showing the photolytic decomposition of the catalyst precursor, the halide Lewis acid $MX_n$ released reacts with the epoxide material with a result exemplified by the following:

(II)

The cationic catalyst is believed to act by cleaving a carbon-oxygen epoxy bond, initiating growth of a polymeric chain or permitting formation of a cross-linkage. A general application of the process embodied by equations I and II as used in the dry photoimaging process herein can be as follows: a diazonium complex salt, for example, as identified hereinabove, is admixed, with the use of a suitable solvent, with the epoxy copolymer. The mixture is thereafter coated on a suitable substrate such as a metal plate, rubber, wire screen, ceramic, glass, plastic, or paper, and the substrate is exposed imagewise to an energy source, for example, actinic radiation. The original image source to be recorded may be a photographic transparency with a halftone or continuous tone image, alphanumeric information, line-drawing or any other type of image. It may also be an image which is projected by means of actinic radiation or scanned by means of a laser or electron beam. On exposure, the diazonium compound decomposes to yield the Lewis acid catalyst, which initiates the polymerization and hardening of the epoxy copolymer in the exposed areas.

After exposure, the coating is heated to the softening point of the unexposed coating, about 55° to 75° C, and a toner powder is applied to the surface by any convenient means as by brush, fluidized bed, spray, etc. The excess colorant powder not absorbed or attached to the surface is then removed therefrom in any convenient way, for example by employing a vacuum, vibration, air blowing, brush or absorbent pad, etc. An image results with optical density in direct proportion to that of the original image. The system reproduces positive from positive or negative from negative, i.e. the more exposed the area is, the less color it will pick up. The copy may then be re-exposed to the energy source to fade away the yellow color in the background which may be present due to unphotolyzed photoinitiator. This step, together with a final heating step, if desired, may be employed to stabilize the image and fuse the toner in place although such steps are not necessary in most cases. In a preferred embodiment, the toner is specially selected to convey specific properties to the coated substrate as will be illustrated further hereinbelow.

The source of radiation for carrying out the method of the present invention can be any suitable source, such as the actinic radiation produced from a mercury, xenon, or carbon arc, a beam from a laser source, for example a He-Cd laser, or the electron beam produced in or from a cathode ray gun. The only limitation placed on the radiation source used is that it must have an energy level at the irradiated film sufficient to impart to the polymerizable system energy at an intensity high enough to reach the decomposition level of the photosensitive compounds. As previously noted, the wavelength (frequency) range of actinic radiation is chosen to obtain sufficient absorption of energy to excite the desired decomposition.

The procedures for mixing the radiation-sensitive compositions of the present invention using the copolymeric epoxide are relatively simple. The epoxide is combined with the catalyst precursor in a suitable inert volatile solvent. By such a suitable solvent is meant any solvent compound or mixture which boils below about 190° C and which does not react appreciably with the epoxide or the catalyst precursor. Examples of such solvents include acetone, methyl ethyl ketone, dimethyl ether of diethylene glycol (bis(2-methoxyethyl ether), monochlorobenzene, o-chlorotoluene, o-dichlorotoluene, acetonitrile, butyronitrile, cyclohexanone, tetrahydrofuran or mixtures thereof and also mixtures of these solvents with other compounds in which the copolymer is substantially insoluble such as toluene, ethyl ether, anisole, 1,1,2,2-tetrachloroethane and trichloroethylene.

The amount of catalyst precursor employed should be sufficient to insure complete polymerization. It has been found that quite satisfactory results are obtained by providing a diazonium complex salt in amount by weight from about 0.5% to about 5% of the catalyst precursor relative to the weight of the polymerizable material provided, about 1% or less of the precursor being amply effective.

Various materials may be employed as toners or pigments herein provided that the powdered material is dry and nontacky under the processing conditions employed in the imaging process. It is possible according to the invention to selectively apply specific toners or pigments to convey specific properties to the coated substrate. For example, materials with either ink attracting or ink repelling properties may be selectively applied. Such materials adhere only to the unexposed areas of the coated substrate forming a coating over these areas in an imagewise manner to impart specific properties, as desired, without affecting the exposed or non-imaged area.

Thus, in the use of the invention for the manufacture of printing plates, for example, a hydrophilic powdered material may be employed to render the original image areas oleophobic when the plate is first wet with water. Similarly, it is possible to apply an oleophobic substance to render the image oleophobic without using water or to apply an oleophilic material to enhance the oily-ink receptivity of the original image areas.

Suitable powdered materials that may be applied to create oleophobic areas include Teflon, poly(tetrafluoroethylene), silicone release agents such as Dow-Corning, Syl-off 23, Syl-off 291, c4-2114, or 4-2125, etc. (See A. E. Bey, *Adhesives Age,* October, 1972, p. 29–30 for a description of typical silicone release agents.)

Examples of powdered materials that may be applied to create hydrophilic areas include polyacrylamide, alumina, aluminum, natural and synthetic polyhydroxylated polymers such as polyvinyl alcohol, polyvinyl pyrrolidone, polyacrylic acid, etc.

Oleophilic substances suitable for use include p-phenylenediamine silica, azobisformamide, etc.

Various dyes, pigments and color-forming components are also suitable for use as the toner herein. Among the dyes and pigments useful in the invention are commercially available powders such as Lumigraphic R Orange (Imperial Dye Co.); Graphtol Green, Acetosol Blue, Acetosol Blue RLS (CI Solvent Blue 45), Acetosol Fire Red 3 GLS (Sandoz Products, Ltd); Irgasol Black RL, Irgasol Blue 2 GLN, Orasol Brown GR, Orasol Black 2RG (CI Solvent Black 2) (Ciba-Geigy); Yellow Toner CAT. No. 22-144; 914 Copier Toner (Xerox Corp.); BLK 4LOT4; BLK 2 LOT 8 (E. I. Dupont) FW2-4 Toner, HB5-18, FW2-40A (Nashua Corp.); powdered carbon, graphite, talcum, titanium dioxide, phosphor particles, ceramics, clays, metal powders such as aluminum, silver, copper, iron, bronze, etc. and their oxides and various mixtures and combinations of any of these. The use of conductive metal powders applied in a predetermined pattern to create distinct conductive paths on the surface may be applied to the production of electronic circuits as on a printed circuit board and are particularly useful herein. Additionally, certain metal oxides may be employed to convey magnetic properties to the substrate.

Particle sizes of the developing powders or toners useful in this invention are not critical and may vary as desired. In general, the toners have particles of sizes from about 0.2 to about 40 microns, preferably 0.2 to 1 micrometers ($\mu$m).

Similarly, thicknesses of the coating layer applied to the substrate may vary, generally within the range of about 0.2 to 50, preferably 0.2 to 20 micrometers.

If desired, in yet another embodiment of the invention, the tackiness of the unexposed coating may be enhanced by use of mixtures of liquid epoxides with the copolymers of the invention as illustrated hereinbelow. Such epoxides include liquid epoxides, such as cycloaliphatics for example bis(cycloalkyl) esters and ethers, low molecular weight bis-phenol A glycidyl ether, polyglycidyl ethers of polyhydric alcohols, polyglycol diepoxides, etc.

In summary, the imaging process of the invention comprises admixing the copolymer with a suitable aromatic diazonium salt of a complex halogenide, applying said mixture to a substrate, and exposing the coated substrate to irradiate ion through a transparency or a mask or other material having opaque portions. Following exposure, softening of the unexposed area of the coating is effected, preferably by heating from about 55° C to about 75° C, and the developing powder or toner is applied to the tacky, unexposed area of the coating, resulting in an image with optical density in direct proportion to that of the original image.

In somewhat greater detail, the toner is applied to the coating while the unexposed powder receptive areas thereof are in a softened, tacky condition and the coating is at a temperature below the melting point of the exposed, cured copolymer and of the powder. The powder is distributed over the area to be developed and becomes adhered or imbibed therein. After the powder application, excess powder is removed by suitable means, as by a blower or wiping with a pad or brush or vacuum, etc.

The instant dry imaging system employing the copolymer of the invention is characterized by utilizing a coating which is tack-free at room temperature so that it can be stacked or rolled prior to processing. Additionally, contact prints may be made without moving the surface. With prior procedures utilizing coatings that are tacky at room temperature, this is not possible unless a protective cover is used such as a sheet of plastic film. The imaging system of this invention is not inhibited by atmospheric oxygen and therefore eliminates the need for protective plastic film coverings employed heretofore for this purpose. The system reproduces positive from positive or negative from negative, i.e., the more exposed an area is, the less color it will pick up. If desired, the developed image may be re-exposed to irradiation to fade away yellow background color which may be present as a result of unphotolyzed photoinitiator. This step plus a final heating step, if desired, will serve to stabilize the image and further fuse the toner in place. It will be understood that such additional steps are optional and are not necessary for the successful operation of the invention.

The imaging system of the invention is eminently suitable for use in computer printouts, package printing, office photocopying, contact photographic prints; photographic imaging in general; laser recording, electron beam recording, transfer processes, plateless printing, printed circuits, etc.

The following examples will serve to further illustrate the process of the present invention.

EXAMPLE 4

A solution containing 9g of the glycidylacrylateallyl glycidyl ether copolymer of Example 1A, 75.9g butyronitrile, 15.2g o-chlorotoluene, and 0.45g 2,5-diethoxy-4-(p-tolylthio) benzene diazonium hexafluorophosphate was whirl-coated onto aluminum plate and onto Mylar film (a commercially available polyethylene terephthalate film), respectively, at 60 rpm.

Samples of the coatings were exposed for ¼ to 1 second at 22cm. distance from a 360 Watt Gates Raymaster Uviarc lamp through various photographic transparencies consisting of line-drawings and continuous tone images.

Following exposure, the samples were heated for 5 to 15 seconds at 60°–70° C under an infrared heat lamp. After removal of the lamp, Xerox 914 copier toner was dusted on and brushed off using a pad of absorbent cotton. The result was a black positive reproduction of the original image. Microfilm images were also copied with resolution to about 50 line-pairs/mm.

EXAMPLE 5

The procedure of Example 4 was repeated employing the same formulation except that the following dyes or pigments were substituted for the Xerox toner:

Lumigraphic R Orange
Acetosol Green BLS
Acetosol Fire Red
Graphtol Green
Acetosol Blue RLS Following exposure and development as in Example 4, all of the above dyes or pigments gave images varying in resolution and reaching 100 line-pairs/mm in several cases. The sharpest resolution in this series was obtained with Acetosol blue RLS which also gave a good copy of a continuous tone positive transparency.

EXAMPLE 6

The procedure of Example 4 was repeated employing the same formulation therein. However, the transparencies were positive microfilm on 35mm frames (to 50 line-pairs/mm resolution) and on microfiche (to 100 line-pairs/mm). The pigments employed were Orasol black, Orasol brown GR, Irgasol black RL and Irgasol blue 2 GLN. Even the smallest letters of the 35mm format were resolved with Orasol brown, Irgasol black and Orasol black while with Irgasol blue only the larger letters were resolved. With Orasol black even the smallest letters (100 line-pairs/mm) of the microfiche format were resolved while Orasol brown and Irgasol black resolved only larger letters on this format.

EXAMPLE 7

The following formulation was prepared with the addition of liquid epoxy ERL 4234, a cycloaliphatic epoxide, 2-(3,4-epoxycyclohexyl-5-5-spiro-(3,4-epoxy) cyclohexane-m-dioxane available commercially from Union Carbide, to enhance the tackiness of the unexposed coating and therefore the toner takeup of the coating:

7g of the copolymer of Example 1A
2g ERL 4234
75.9g butyronitrile
15.1g o-chlorotoluene
0.450g 2,5-diethoxy-4-(p-tolylthio)benzene diazonium hexafluorophosphate Whirl coatings were made on Redicote brush-grain aluminum as in Example 3. Samples of coated aluminum were exposed through photographic transparency images of a continuous tone positive, a microfiche negative and 35mm copies of fine print and line-drawings. Exposure was about ½ to 1 second at 22cm from a 360 Watt Uviarc lamp. After exposure, each sample was heated for about 10 seconds at 60° C. Then each sample was dusted over with Xerox 914 copier toner. In each case an excellent positive black copy of the original image was achieved. Exposure of a Kodak No. 2 step tablet with 21 steps of optical density from 0.05 to 3.5 for 3 seconds resulted in a copy, after processing, with either completely colorless steps or shades of gray corresponding to the first 12 steps of the tablet. Other images were made using Acetosol blue and DuPont Toner BLK 4 LOT 4, both of which were rated as excellent.

EXAMPLE 8

A formulation containing 8g of the copolymer of Example 1B, 67.5g butyronitrile, 13.5g o-chlorotoluene and 0.40g 2,5-diethoxy-4-(p-tolylthio) benzene diazonium hexafluorophosphate was whirl-coated on aluminum, exposed and processed as in Example 7 employing DuPont Toner BLK 4 LOT 4. A good reproduction of line drawings and printed matter was obtained.

EXAMPLE 9

A formulation containing 9G of the copolymer of Example 2, 75.9g butyronitrile, 15.1g o-chlorotoluene and 0.450g of 2,5-diethoxy-4-(p-tolylthio) benzene diazonium hexafluorophoshate was whirl-coated on aluminum and expoed and processed as in Example 6 employing DuPont Toner BLK 4 LOT 4. In addition to a good line drawing, alpha-numeric information on 35mm film and a continuous tone photograph were copied successfully.

EXAMPLE 10

A. A solution was prepared consisting of 18g. of the copolymer of Example 1A, 151.8 g butyronitrile, 30.2g o-chlorotoluene and 0.90g of 2,5-diethoxy-4-(p-tolylthio) benzene diazonium hexafluorophosphate. The solution was used to make coatings at 60 rpm on brush grained aluminum litho plate samples.

B. Coated plates were exposed for 1 second through a positive bar chart transparency image to a 360W Uviarc lamp at 22 cm distance. The plates were then heated at 60°-70° C for 5 to 15 seconds under an infrared lamp. Immediately after removal from the lamp and while still hot, the plates were dusted over with silica and p-phenylenediamine hydrochloride respectively. When the plate had cooled to room temperature, the excess powder was wiped off with absorbent cotton. In each case the powder remained only on the unexposed areas corresponding to the black lines of the original image.

The thus obtained imaged plates were heated for 1½ hours at 165°-170° C after which they were rubbed over with Lithographic Black Process Ink (M&T Chemicals) and wiped dry with absorbent cotton. In each case, the ink was taken up only in the image areas which had been coated with the powdered toner indicating production of a positive-working printing plate.

EXAMPLE 11

The procedure of Example 10 was followed for two different plates up to the preparation for application of powder. In this example, the powders used were Elvanol (polyvinyl alcohol) and alumina, respectively. Each powderimaged plate was then heated for three minutes at 165°-170° C. Before applying ink, they were wet with water which adhered to the image areas only. When the ink of Example 10 was applied, it was taken up by all areas of the plate but preferentially in the non-image area (originally exposed area) which will become the image-printing area because of its ink-receptivity. This is, therefore, a negative-working plate.

EXAMPLE 12

The procedure of Example 10 was repeated except that Teflon powder was employed as the developing material. The toner adhered only to the unexposed area corresponding to the original image. The Teflon-developed plate was given an overall exposure to ultraviolet radiation for two minutes to complete the curing of the image areas. When linked, a negative-working plate was obtained since the ink was selectively taken up only by the non-image areas which were free of Teflon.

EXAMPLE 13

The powder of Example 10 was replaced by azobisformamide, an organic foaming agent available commercially as Cellogen AZ (Uniroyal Chemical Division, Naugatuck Chemicals, Inc). After formation of the powder image, the plate was heated for 1½ hours at 165°-170° C. When inked with Red Developer ink (Minnesota Mining and Manufacturing Company), the ink was taken up only by the image areas bearing the Cellogen AZ toner. It was found that the image elements could be raised or expanded by heating the plate to 190°-200° C for 5 minutes prior to inking thus forming a relief image.

EXAMPLE 14A

A 15% solution of the copolymer of Example 3 in a 6:1 solution of butyronitrile and o-chlorotoluene was containing 5% of the resin weight of 2,5-diethoxy-4-(p-tolylthio) benzene diazonium hexafluorophosphate was spin coated onto Cronar at rpm spinner speed. After drying, a contact copy of a 24X reduction microfiche was made by 10 seconds exposure to a 125W Aristo Grid Lamp with maximum output between 365 and 420 nm. The exposed film was put through the hot rollers of a Kalvar Dry Developer machine, set at 130° C for 2 passes, each pass being of a few seconds duration. While still hot, the film was dusted with Nashua Corp. toner No. FW2-40A. After brushing off the excess toner, a sharp, positive copy of the original microfiche information was obtained, but not as dark as a similarly processed coating made with the copolymer of Example 1A.

The method of heating the exposed coating in this example does not imply that a surface temperature of 130° C was required. It was found, however that the Kalvar Dry Developer machine was a good device for rapidly raising the surface temperature to about 60° C during the rapid movement of the sample through the hot roller-conveyor belt system of this machine.

EXAMPLE 14B

Into a 2000 milliliter resin flask was placed 22.5 grams of allyl glycidyl ether (0.197 moles), 101.3 grams of glycidyl acrylate (0.792 moles) and 37.5 grams of glycidyl methacrylate (0.264 moles). Also added to the reaction mixture was 500 mls. of methyl ethyl ketone as solvent and 1.46 grams of benzoyl peroxide as the initiator. The flask was provided with a ground class stirrer assembly reflux condenser and thermometer. The mixture was stirred vigorously while heating at reflux for 5 hrs., then left to cool to room temperature without stirring. The reaction solution was slowly added to rapidly stirred 1500 milliliters of methanol in a beaker. A sticky white residue formed. It was washed with methanol and transferred to a Teflon-lined baking pan for drying. Drying was done at room temperature and atmospheric pressure and finally down to a vacuum of 20 psi. The very final drying was done at 0.5 mm pressure. 108 grams of a rubbery solid was obtained which was drier and not as elastic as the copolymer prepared in Example 3. The terpolymer had an inherent viscosity of 0.20 and epoxy equivalent/100 grams equal to 0.74. A 15% solution of this polymer was made up in a 6:1 butyronitrile-o-chlorotoluene solvent mixture similar to that used in Example 14A, also containing an amount of 2,5-diethoxy-4-(p-tolylthio) benzene hexafluorophosphate catalyst equivalent to 5% of the resin weight. Coatings were prepared and dried and then exposed imagewise as in Example 14A. When the coating was heated and toner applied as in Example 14A, it had little or no toner receptivity since the polymer had little or no tackiness on its surface.

It will be seen from Examples 14A and B that terpolymers of allyl glycidyl ether, glycidyl acrylate and glycidyl methacrylate are effective for use in the dry photopolymer imaging process of this invention as long as the glycidyl methacrylate is employed in amounts that do not exceed about 0.25 mole per mole of glycidyl acrylate present in the polymerizable monomer mixture. As shown in Example 14B, amounts in excess of this proportion act to remove the useful tackiness property resulting in little or no toner receptivity.

While the process has been described hereinabove as primarily an imaging process, it should be understood that the compositions of the invention are also suitable for use as coatings and particularly in instances where it may be desired to prepare a surface for future receptiveness of color or other uses to which toners may be put. In such a process, portions of the coated substrate are not screened from irradiation as described hereinabove. The copolymer or terpolymer together with catalyst therefor is coated on a suitable substrate such as, for example, aluminum, plastic, or any of the substrates identified hereinabove, and dried. Being non-tacky at room temperature, the coated substrate may be readily stored until use is desired at which time, the coated substrate is heated to soften its surface, in general at 55° C to about 75° C, toner is applied and imbibed therein after which the thus treated surface is exposed to irradiation without screening to provide a colored, cured, solvent-insoluble coated substrate.

While there have been described particular embodiments of the invention, including those at present considered to be the preferred embodiments, it will be obvious to those skilled in the art that various changes and modifications may be made therein without departing from the invention, and it is aimed, therefore, to cover in the appended claims all such change and modifications as fall within the true spirit and scope of the invention.

We claim:

1. A polymer, polymerizable to higher molecular weights through the action of a cationic polymerization catalyst, selected from the group consisting of copolymers of glycidyl acrylate and allyl glycidyl ether and terpolymers of glycidyl acrylate, glycidyl methacrylate and allyl glycidyl ether containing up to about 0.25 mole of glycidyl methacrylate per mole of glycidyl acrylate, said polymer having pendant epoxy groups, an epoxide equivalent of at least about 0.64 per 100g. of polymer and an inherent viscosity of from about 0.09 to 0.28 as measured in butyronitrile at 25° C; said polymer being substantially non-tacky at room temperature, tacky at an elevated temperature and convertible to a non-tacky condition upon exposure to irradiation in the presence of a radiation-sensitive catalyst which releases a Lewis Acid effective to initiate further polymerization of said polymer.

2. A polymer as claimed in claim 1 wherein the inherent viscosity is 0.19 –0.25.

3. A polymer as claimed in claim 2 wherein the epoxide equivalent is about 0.69 –0.75 per 100g of polymer.

* * * * *